United States Patent [19]

Burch et al.

[11] Patent Number: 5,407,626
[45] Date of Patent: Apr. 18, 1995

[54] QUATERNARY AMMONIUM POLYARYLAMIDES, USED TO MANUFACTURE ARTICLES AND ADHERE POLYAMIDE OBJECTS

[75] Inventors: Robert R. Burch, Exton, Pa.; Lewis E. Manring, Wilmington, Del.

[73] Assignee: E. I. Du Pont de Nemours and Company, Wilmington, Del.

[21] Appl. No.: 73,293

[22] Filed: Jun. 11, 1993

Related U.S. Application Data

[60] Division of Ser. No. 821,835, Jan. 13, 1992, Pat. No. 5,242,991, which is a continuation of Ser. No. 445,956, Nov. 28, 1989, abandoned.

[51] Int. Cl.$^6$ ............................................. B29C 39/14
[52] U.S. Cl. ........................... 264/204; 156/243; 156/308.6; 162/157.3; 264/126; 264/184; 264/211.15; 264/331.19; 264/341; 264/343
[58] Field of Search ................. 264/204, 205, 211.15, 264/331.19, 341, 343–344, 184, 78, 126; 156/242, 243, 308.6; 162/157.3

[56] References Cited

U.S. PATENT DOCUMENTS

| | | | |
|---|---|---|---|
| 3,356,626 | 12/1967 | Reeder | 264/184 |
| 3,574,158 | 4/1971 | Coleman | 264/78 |
| 3,983,095 | 9/1976 | Bashaw et al. | 264/205 |
| 4,108,936 | 8/1978 | Wolf et al. | 264/78 |
| 4,160,755 | 7/1979 | Choe et al. | 264/205 |
| 4,785,038 | 11/1988 | Sweeney | 524/173 |
| 4,824,881 | 4/1989 | Kim | 524/82 |
| 4,889,579 | 12/1989 | Burch | 156/305 |
| 4,997,714 | 3/1991 | Farrar et al. | 264/205 |
| 5,006,629 | 4/1991 | Santa et al. | 528/183 |
| 5,024,858 | 6/1991 | Burch | 427/123 |
| 5,084,497 | 1/1989 | Burch, Jr. et al. | 524/173 |

FOREIGN PATENT DOCUMENTS

| | | | |
|---|---|---|---|
| 0121091 | 10/1984 | European Pat. Off. | C08G 69/48 |
| 0309229 | 3/1989 | European Pat. Off. | D01F 6/60 |
| 53-07615 | 1/1978 | Japan | 264/204 |

OTHER PUBLICATIONS

Takayanagi et al., N-Substituted Poly(p-Phenylene Terephthalamide), *J. Poly. Sci: Polym. Chem. Ed.*, 19, 1133–1145, 1981.

Takayanagi et al., Syntheses and Characterization of N-Grafted Poly(p-Phenylene Terephthalamide), *J. Poly. Sci: Polym. Chem. Ed.*, 21, 31–39, 1983.

Bodaghi et al., Poly(p-Phenylene Terephthalamide) Films Formed From Extrusion and Coagulation of Liquid Crystalline Sulphuric Acid Solutions: Characterization of Orientation and Void Structure, Annealing, and Upgrading of Film Mechanical Properties, *Polym. Eng. Sci.*, 24 (4), 242–251, 1984.

Aoki et al., Characterization and Continuous Extrusion of Isotropic and Anisotropic Poly(p-Phenylene Terephthalamide)/Sulfuric Acid Solutions to Form Ribbons and Blown Film, *Polym. Eng. Sci.*, 20 (3), 221–229, 1980.

Flood et al., Process for the Formation of Biaxially Oriented Films of Poly(p-Phenylene Terephthalamide) from Liquid Crystalline Solutions, *J. Appl. Polym. Sci.*, 27, 2965–2985, 1982.

Bordwell et al., Nitrogen Acids. 1. Carboxamides and Sulfonamides, *J. Org. Chem.*, 41 (14), 2905–2906, 1976.
Bordwell, Equilibrium Acidities in Dimethyl Sulfoxide Solution, *Acc. Chem. Res.*, 21, 456–463, 1988.

*Primary Examiner*—Jeffery R. Thurlow

[57] ABSTRACT

Quaternary ammonium polyarylamides are provided that are useful in articles of manufacture that require minimal ionic impurities. The polyarylamides are produced by reacting certain polyamides together with quaternary ammonium bases of the formula $R^4{}_4N^+X^-$, wherein each $R^4$ is independently selected from hydrocarbyl or substituted hydrocarbyl, provided that at least one of the $R^4$ groups contains at least one beta hydrogen atom. There is also provided the process for producing the polyarylamides, the process for making articles of manufacture from the polyarylamides, and a process for modifying the surfaces of such polyamides.

13 Claims, No Drawings

QUATERNARY AMMONIUM POLYARYLAMIDES, USED TO MANUFACTURE ARTICLES AND ADHERE POLYAMIDE OBJECTS

This is a division of application Ser. No. 07/821,835, filed Jan. 13, 1992, now U.S. Pat. No. 5,242,991 which is a continuation of 07/445,956, filed Nov. 28, 1989, now abandoned.

FIELD OF INVENTION

The present invention relates to quaternary ammonium polyarylamides formed from quaternary ammonium bases and polyamides. More particularly, this invention relates to quaternary ammonium polyarylamides that, upon heating decompose to the parent polyamide and volatile nonionic byproducts. The invention further relates to processes for producing the quaternary ammonium polyarylamides and making parts from them, and processes for modifying the surface properties of polyamides.

BACKGROUND OF THE INVENTION

The preparation of alkali metal salts of polyamides and solutions thereof in dimethylsulfoxide is well known. For example M. Takayanagai and T. Katayose in *J. Polym. Sci., Polym. Chem. Ed.*, vol. 19, 1133-1145 (1981) describe the preparation of the sodium salt of poly(p-phenylene terephthalamide) (hereinafter PPTA) by the reaction of sodium hydride in dimethylsulfoxide (hereinafter DMSO). These sodium salts were used to N-alkylate the polymer by the reaction of a polyarylamide with the appropriate hydrocarbyl halide. The same authors used the same polyarylamides to graft other polymers to PPTA, *J. Polym. Sci., Polym. Chem. Ed.*, vol. 21, 31-39 (1983).

U.S. Pat. No. 4,785,038 describes the dissolution of polyamides in solutions containing certain sodium or potassium bases, a liquid sulfoxide, and water or an alcohol.

U.S. Pat. No. 4,824,881 describes a method for deprotonating polyamides with an alkali metal alkoxide or amide to form a polyarylamide polyanion solution in a liquid sulfoxide.

In all of the above references the only cations specifically mentioned or used are alkali metal cations. There is no mention or use of quaternary ammonium cations as the counterions for polyarylamides. In order to form useful articles from the above polyarylamide alkali metal salts it is necessary to neutralize the salts and preferably remove as much of the ionic impurities (the alkali metal salts from the neutralization) as possible, since such ionic impurities are usually deleterious in the final use of such parts. Even traces of such ionic impurities are especially deleterious, for example, in electrical and electronic uses. It is usually difficult to wash out the last traces of such ionic impurities.

H. Bodaghi et. al., *Polym. Eng. Sci.*, vol. 24, 242-251 (1984); H. Aoki, et. al., *Polym. Eng. Sci.*, vol. 20, 221-229 (1980); J. E. Flood, et. al., *J. Appl. Polym. Sci.*, vol. 27, 2965-2985 (1982) all describe the preparation of films and other parts from sulfuric acid solutions of PPTA. The "coagulants" used in these processes, usually water or lower alcohols, serve not only to coagulate the polymer from the sulfuric acid solution but also to wash the corrosive and ionic sulfuric acid from the coagulated polymer.

It is an object of the present invention to provide quaternary ammonium polyarylamides formed from quaternary ammonium bases and polyamides. It is a feature of the present invention (to provide unique polyarylamides) as well as processes for the preparation thereof and for the development of polymeric articles, the resulting polyamide articles being substantially devoid of ionic impurities. An advantage of the present invention is its usefulness in forming shaped articles having minimal ionic impurities, such as electronic circuit boards and the like. These and other objects, features and advantages of the present invention will become readily apparent upon having reference to the following description of the invention.

SUMMARY OF THE INVENTION

Quaternary ammonium polyarylamides comprising polyarylamides derived from polymer repeat units independently selected from the group consisting of

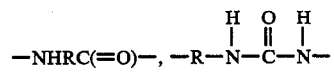

and

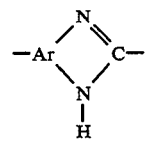

wherein:
R is selected from $R^3$ and $R^1NHC(=O)R^2$,
$R^1$ and $R^3$, independently, are selected from m-phenylene, p-phenylene, 3,3'-biphenylene, 3,4'-biphenylene, 4,4'-biphenylene and 4,4'-diphenylene ether,
$R^2$ is selected from $R^1$ and

Ar is 1,2,4-benzenetriyl, and
x is 1 to 10,
the polyamide having a molecular weight of at least about 2500; and quaternary ammonium cations of the formula

wherein each $R^4$ is independently selected from hydrocarbyl or substituted hydrocarbyl, provided that at least one of the $R^4$ groups contains at least one beta hydrogen atom. Also provided is a process for producing such quaternary ammonium polyarylamides, a process for making parts from such quaternary ammonium polyarylamides and a process for modifying the surfaces of polyamides.

DETAILED DESCRIPTION OF THE INVENTION

When the polyarylamide of the present invention is formed, a hydrogen ion (proton) is removed from the amido group nitrogen atom to form an anion. The terms polyamide and amido herein mean a polymer and functional group (not necessarily a —C(=O)NH— group) respectively that still has all of its hydrogens attached (not deprotonated) to its nitrogen atoms, while the term amide means a deprotonated functional group, and the term polyarylamide means a polymer that is at least partially deprotonated (a polyanion). Of course when more than one proton is removed from any polymer molecule, a polyanion is formed. The chemistry of forming such amide anions (with alkali metal bases) is well known to those skilled in the art, see for example M. Takayanagai and T. Katayose, *J. Polym. Sci., Polym. Chem. Ed.*, vol. 19, p. 1136, which is hereby included by reference, and is analogous to the present reaction.

The polymers useful in this invention for forming quaternary ammonium polyarylamides are aromatic polyamides (as in an aramid), polybenzimidazoles, and polyureas containing the —NH— function as part of the urea group. All of these polymers are referred to as polyamides herein. Aromatic polybenzimidazoles useful in this invention are described in U.S. Pat. No. 3,551,389, useful aramids are described in U.S. Pat. Nos. 3,869,429 and 4.075,172, while useful aromatic polyureas are exemplified in U.S. Pat. No. 3,418,275, all incorporated by reference herein. Useful polymers include, but are not limited to, PPTA, poly(m-phenylene isophthalamide), poly (p-benzamide), poly (4,4'-biphenylene isophthalamide), poly (chloro-p-phenylene isophthalamide), polybenzimidazole from 3,4,3',4'-tetraaminobiphenyl and isophthalic acid and the polybenzimidazole of 3,4-diaminobenzoic acid. Preferred polymers are PPTA, poly(m-phenylene isophthalamide) and poly (p-benzamide). Especially preferred are PPTA and poly(m-phenylene isophthalamide). Block copolymers that contain one or more blocks of the above polymers [optionally with blocks containing other (nonpolyamide) monomer units] also are useful in the present invention.

The quaternary ammonium cations of the present invention have the formula

wherein each $R^4$ group is independently selected from hydrocarbyl or substituted hydrocarbyl provided that at least one of the $R^4$ groups contains at least one beta hydrogen atom. By substituted hydrocarbyl is meant a hydrocarbyl group than contains substituents or functional groups that do not interfere with the formation or decomposition of the quaternary ammonium polyarylamide, and which obviously will not make the ammonium base used in the formation of the salt unstable. A suitable functional group is ether (joining two segments of hydrocarbyl chains). By beta hydrogen is meant the grouping

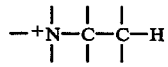

wherein the "open" bonds may be any of the groups as defined above, or parts of carbocyclic or heterocyclic (but not aromatic) rings. It is preferred that the quaternary ammonium cation have a molecular weight of less than about 350, and more preferred that the molecular weight be under 250, so that the free amine formed in the thermal decomposition of the salt is volatile enough to vaporize during the decomposition reaction. Preferred quaternary ammonium ions are tetraethylammonium and tetra-n-butylammonium.

The quaternary ammonium polyarylamides may be isolated as relatively pure compounds (but usually containing solvating molecules such as DMSO), or be made or used in solution. Dialkylsulfoxides are preferred solvents, and DMSO is especially preferred.

The amido protons of the polymers may be completely reacted ("neutralized") so that essentially all of the amido groups in the polymer are converted to amide ions, or as little as 0.1% may be reacted. The polymer will become soluble at some intermediate value between the two. The polyamide may be in solution at the beginning of the process, as the reaction may be carried out by combining a solution of the polymer with a solution of the quaternary ammonium base. The minimum amount of reaction needed for solubility will depend on the polymer composition, the solvent used, the temperature, the concentration and the quaternary ammonium cation used, and may be determined by simple experimentation. The lower end of the range of reaction is especially useful where surface modification of a part (e.g. film, fiber, etc.) is desirable, as for promoting adhesion of the polyamide to itself. The proportion of the protons removed from amido groups may be controlled by the ratio of quaternary ammonium base (infra) to polymer (the more base used the higher the proportion of amido groups reacted), or by partial neutralization by a stronger acid of the quaternary ammonium amide groups in the polyarylamide.

The process for making the quaternary ammonium polyarylamides of the present invention comprises contacting the polyamides with a solution of a basic compound of the quaternary ammonium ion such as hydroxide or alkoxide. The quaternary ammonium base is dissolved in a solvent, and the solvent may also be a solvent for the quaternary ammonium polyarylamide is produced. Quaternary ammonium bases are usually soluble in highly polar compounds such as water or alcohols, and in dialkylsulfoxides, especially DMSO. When making the polyarylamide it is important not have too high a concentration of hydroxylic compounds such as water and alcohols present. It is understood by those skilled in the art that even though the protons on the amido groups may be more acidic than those in water and alcohols, a large amount of hydroxyl groups present could shift the equilibrium so that much of the quaternary ammonium salt present is as the hydroxide or alkoxide rather than the polyarylamide polyanion. Excess water and/or alcohol may be removed under vacuum at 60° C. or below, preferably at about room temperature.

Compounds which are more acidic (have a lower pKa) than the proton on the amido nitrogen should not be present. A compilation of acidities (pKas) of various acids in DMSO is available, see F. Bordwell, *Acc. Chem. Res.*, vol. 21, 456–463 (1988). It is believed that the pKas of the amido protons of the present polymers are about 19–29 in DMSO.

The quaternary ammonium polyarylamide may be formed at temperatures ranging from about 0° C. (or the freezing point of the solvent, whichever is higher) to about 60° C., preferably about 20° C. to about 40° C. If the polymer is to be dissolved, the overall reaction time usually ranges from about 0.5 to about 24 hr. However, this time may vary widely, depending especially on the state of division of the polymer, the more finely divided the polymer, the faster the dissolution. Moderate to vigorous stirring and/or sonication is desirable to accelerate the dissolution. Since excess water should be excluded, it is convenient to make the polyarylamide under an inert atmosphere such as nitrogen or argon. The starting materials should be substantially dry (free of water), however most quaternary ammonium bases contain some water which is difficult to remove completely.

These bases are often available in hydroxylic solvents. In order to keep the total amount of hydroxylic compound low, it is often desirable to remove as much of the solvent from the quaternary ammonium base by removing the solvent under vacuum at approximately room temperature or below.

The quaternary ammonium bases suitable for use in this process have the formula $$R^4{}_4N^+X^-$$

wherein each $R^4$ is independently selected from hydrocarbyl and substituted hydrocarbyl, providing that at least one of $R^4$ contains at least one beta hydrogen atom, and wherein X is an anion whose conjugate acid has a pKa greater than that of the hydrogen attached to the amido group in the unreacted polymer, in the solvent in which the reaction is carried out. Preferred anions are hydroxide and alkoxide. Preferred quaternary ammonium ions are tetraethylammonium and tetra-n-butylammonium.

The quaternary ammonium polyarylamides may be isolated by removing the solvent at reduced pressure at low temperature (less than about 60° C.) or by adding the solution of the polymer salt to an aprotic nonsolvent, thereby precipitating the polymer salt. It may then be isolated by filtration.

Many of the above features of the above process are illustrated in the Examples.

While the polyamide may be regenerated by reaction with acid, such regeneration normally results in at least traces of ionic material remaining in the polymer. In the case of the present quaternary ammonium polyarylamides, heating of these salts can lead to formation of the original (protonareal) polyamide, along with olefin and tertiary amine byproducts. The olefin and tertiary amine are usually volatile, and are removed by vaporization during the heating period.

This reaction to regenerate the original polymer on heating (pyrolysis) is believed to be a variation of the well known (to those skilled in the art) "Hofmann elimination." For a review of this reaction see A. C. Cope and E. R. Trumbull, Organic Reactions, Vol. 11, John Wiley & Sons, Inc., New York, 1960, p. 317–493. Most Hofmann elimination reactions have been run using the hydroxide of the ammonium cation, but other basic anions will also work. It is believed the amide anion which is part of the polymer chain performs a similar function in this invention.

It is also well known that the Hofmann elimination has side reactions that compete with the "main" reaction leading to (in the present case) the protonated amide group, olefin and tertiary amine. The most important of these side reactions is the alkylation of the basic anion, which in the present case would be the amide anion nitrogen atom. The proportions of "main" reaction and alkylation reaction depend upon various factors (see Cope and Trumbull, supra), but especially the structure of the quaternary ammonium cation. It is difficult to predict in advance the proportions of such reactions when using the quaternary ammonium polyarylamides, but Experiments 1 and 2 illustrate easily run model reactions, where with minimum experimentation, the proportions of these reactions can be determined for any particular quaternary ammonium cation. Cations can be chosen to maximize either reaction.

The regeneration of the original polymer by heating of the quaternary ammonium polyarylamide, so that the Hofmann elimination takes place, is a superior method than the reaction of a metal salt of the polyarylamide and subsequent washing of the polymer, for obtaining polymer free of ionic impurities. Furthermore, even the "side" reaction of alkylation is useful, since alkylation leads to polymers with modified properties, such as higher solubility, as for coatings.

Polymers used to form the quaternary ammonium polyarylamides useful in the pyrolysis reaction consist essentially of one or more of the repeat units:

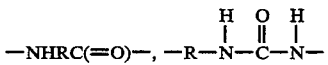

or

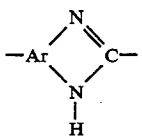

wherein:
R is selected from $R^3$ and $R^1NHC(=O)R^2$
$R^1$ and $R^3$, independently, are selected from m-phenylene, p-phenylene, 3,3'-biphenylene, 3,4'-biphenylene, 4,4'-biphenylene and 4,4'-diphenylene ether,
$R^2$ is selected from $R^1$ and $$-(CH_2)_x-,$$

Ar is 1,2,4-benzenetriyl, and
x is 1 to 10,
the original polyamide having a molecular weight of at least about 2500, and further providing that the quaternary ammonium ions of the quaternary ammonium polyarylamides useful in the pyrolysis reaction have the formula $$R^4{}_4N^+$$

wherein each $R^4$ group is independently selected from hydrocarbyl or substituted hydrocarbyl provided that at least one of the $R^4$ groups contains at least one beta hydrogen atom.

The pyrolysis of the quaternary ammonium polyarylamide is carried out at about 70° C. to about 300° C. or the upper temperature stability limit of the polymer, whichever is lower, preferably about 150° C. to about 300° C., and most preferably about 180° C. to about 250° C. Although the pyrolysis reaction is not affected by air, use of an inert atmosphere such as nitrogen or argon is useful where the polymer is unstable to oxygen at elevated temperatures. The pyrolysis may be done with neat quaternary ammonium polyarylamide or with the quaternary ammonium polyarylamide in solution. While the pyrolysis is taking place it is convenient to remove the solvent by evaporation, and also remove the volatile byproducts of the pyrolysis such as the olefin and tertiary amine. Circulation of gases around the polymer will help remove these compounds. In thicker sections of polymer, boiling of the solvent or rapid production of the volatile olefin and/or tertiary amine may produce bubbles in the polymer. Slowly increasing the reaction temperature will help avoid such problems. The degree of deprotonation of the polymers undergoing the pyrolysis reaction can range from 0.1% to 100%. The pyrolysis reaction is further illustrated in the Examples.

The quaternary ammonium polyarylamides of the present invention may be used to form films, coatings, fibers, etc., especially from solution, that when pyrolyzed regenerate the original polyamide or an N-alkylated polyamide with different properties than the original polymer. In both cases the polymer is essentially free of ionic impurities.

Solutions of quaternary bases may be used to treat the surfaces of polyamides (without dissolution of the polymer) to increase the adhesion of the polymer to itself or to other materials, such as metals (see commonly assigned U.S. patent application Ser. No. 351,962, filed, May 17, 1989, now U.S. Pat. No. 5,024,858 which is hereby included by reference). Again, upon heating the original polyamide may be regenerated containing essentially no ionic impurities. Surface-treatment requires only that a relatively small proportion of the total number of amido groups in the polymer be converted to the quaternary ammonium salt. This proportion will of course vary with the surface to volume ratio of the particular part, but may be as small as 0.1% of the total amount of amido groups in the polymer. Of course for surface treatment the polymer should not dissolve in the solvent.

EXAMPLES

In the following Examples, except where otherwise noted, the quaternary ammonium bases were supplied by the Aldrich Chemical Co., the tetraethylammonium hydroxide as a 40 weight percent solution in water, and the tetra-n-butylammonium hydroxide as a 1.0M solution in methanol. DMSO was Aldrich Gold Label grade, used without further purification. All reactions were done under a nitrogen or argon atmosphere.

EXPERIMENT 1

A nitrogen flushed reaction flask equipped with stir bar was charged with approximately 10 mL anhydrous DMSO and 6.40 mL of a 1.0 molar solution of $(n-Bu)_4N^+OH^-$ solution in methanol. The methanol and a small amount of DMSO was removed by means of vacuum distillation at room temperature. $C_6H_5C(O)NHC_6H_4NHC(O)C_6H_5$, made by reaction of 1 mole p-phenylenediamine with 2 moles of benzoylchloride, 1.0 g, was then added to the reaction vessel against a heavy stream of inert gas. The resulting mixture was stirred for three hours an room temperature. The $((n-Bu)_4N^+)_2C_6H_5C(O)NC_6H_4NC(O)C_6H_5{}^{2-}$ salt was precipitated in pure form by addition of approximately 100 mL of dry diethyl ether. The salt was isolated by filtration and dried in a vacuum for 15 hours at room temperature. $^1$H NMR ($d_6$-DMSO, $+25°$ C.): $+8.05$ ppm (doublet of doublets, 4H, J=7.5 hz, 2.0 hz), $+7.15$ ppm (singlet, 4H), $+7.07$ (multiplet, 6H), $+3.04$ ppm (multiplet, 16H), $+1.48$ ppm (multiplet, 16H), $+1.12$ ppm (multiplet, 16H), $+0.86$ ppm (triplet, 24H, J=15.9 hz). Thermal gravimetric analysis showed loss of 55% of the mass at 179° C., for loss of butone and tributylamine, which was confirmed by mass spectra of the volatiles evolved. A solid state pyrolysis of $((n-Bu)_4N^+)_2C_6H_5C(O)NC_6H_4NC(O)C_6H_5{}^{2-}$ yielded extensively butylated material as evidenced by mass spectrometry, NMR spectrometry, and infrared spectroscopy. Both the N-n-butyl and the bis (N,N'-n-butyl) compounds were detected.

EXPERIMENT 2

A 125 mL Erlenmeyer flask with ground glass stopper was charged with 1.00 g $C_6H_5C(O)NHC_6H_4NHC(O)C_6H_5$ and 10 mL of DMSO. Separately a solution of 1.00 g $Et_4N^+OH^-$ was dissolved in 10 mL DMSO. The solution frothed considerably but the salts dissolved. The resulting solution was combined with the slurry of the oligomer. The resulting solution was stirred for one hour to give a homogeneous solution. 100 mL of dry diethyl ether was added which caused formation of an oil. The supernatant was decanted from the oil. The oil was treated with approximately 4 mL dry tetrahydrofuran no give yellow crystals which were isolated by filtration and dried by means of a vacuum. The 1H NMR suggested that this compound was $(Et_4N^+)_2[C_6H_5C(O)NC_6H_4NC(O)C_6H_5]^{2-}$ with a small amount of water. The $^1$H NMR of this compound in $d_6$-DMSO (ppm tel. to tetramethylsilane): $+8.05$ (doublet of doublets, 4H, J=7.5 hz, 2.0 hz), $+7.5$ (singlet, 4H), $+7.18$ (multiplet, 6H), $+3.60$ (broad singlet, approx. 2H), $+3.12$ (quartet, 16H, J=7.0 hz), $+1.09$ (triplet of triplets, 24H, J=7.0 hz, 2.5 hz). Infrared spectra in a KBr pellet showed the presence of N—H and O—H bonds, indicating that the oligomer was not fully deprotonated. A solid state pyrolysis of this compound at 200° C. gave $C_6H_5C(O)NHC_6H_4NH(O)CC_6H_5$ nearly quantitatively with traces (<1%) of N-ethylated product. A mass spectrometry/pyrolysis probe experiment showed that triethylamine was formed in this process.

EXAMPLE 1

Preparation and Pyrolysis of PPTA Tetraethyl Ammonium Salt

A round bottom flask was charged with 12.5 g of a 25 wt. % solution of $Et_4N^+OH^-$ in methanol. Methanol was removed from this solution by means of vacuum distillation until the solution volume was approximately 9 mL. This base solution was then transferred to a three neck flask containing 55 mL DMSO and 2.5 g PPTA pulp. The PPTA pulp was dissolved in this medium to give a solution that was 3.6 wt. % polymer. A film of this solution was cast on a glass plate at 25 mil (wet thickness) under a dry nitrogen atmosphere. The film was heated to 220° C. under a dry nitrogen atmosphere to give a dense PPTA film.

EXAMPLE 2

Preparation of the $(n-Bu)_4N^+$ Salt of PPTA

A solution (25.2 mL) of 1 molar $(n-Bu)_4N^+OH^-$ in methanol was dissolved in 65 mL DMSO. The methanol was then removed from the solution by means of vacuum distillation. The remaining 55 to 60 mL of clear colorless solution was transferred by cannulation to a three neck flask containing 3.0 g PPTA pulp. After 16 hours of stirring at room temperature, the PPTA pulp was dissolved in this solvent system to form a clear, deep red solution with no evidence for undissolved PPTA as determined by examination of samples under an optical microscope. A film was then cast at 25 mil (wet thickness) on a glass plate and placed in a vacuum at 205° C. with a slow nitrogen purge. The DMSO distilled off leaving a reddish orange film on the glass plate. After approximately 30 minutes at 205° C., the reddish orange color gave way to the tan color characteristic of PPTA films. However, the final film after 24 hours at 205° C. and under vacuum was pale tan and very brittle, characteristic of butylated PPTA films. Infrared spectra of this film showed the presence of alkyl groups, again suggestive that some alkylation had taken place in addition to the Hofmann degradation. Pyrolyses at 175° C. and at 220° C. showed that butene, tributyl amine, and DMSO evolved in the vapor phase from this reaction.

EXAMPLE 3

Bonding of PPTA Pulp Using (n-Bu)$_4$N$^+$OH$^-$ Solutions in DMSO

Ten mL of 1.0 molar (n-Bu)$_4$N$^+$OH$^-$ was dissolved in 40 mL anhydrous DMSO. Methanol (approximately 10 mL) was removed from this solution by vacuum distillation. The resulting 0.2 molar base solution was pulled through a disk of PPTA pulp on a Buchner funnel by means of a vacuum. The pulp was left undisturbed for one hour. Then the pulp was pressed between two poly(tetrafluoroethylene) sheets at 180° C., initially with no pressure to allow volatiles to escape easily, and then finally ramped to 235° C. and 172 MPa and held for 5 minutes. The result was a low density paper like material. The tensile properties of these pulps before and after treatment are shown below.

|  | Before | After |
|---|---|---|
| Tensile Strength (MPa) | 0.93 | 22.1 |
| Elongation at Break (%) | 11.7 | 8.0 |
| Tensile Modulus | 41.4 | 1076 |

EXAMPLE 4

Isolation of the "Neat" (n-Bu)$_4$N$^+$ Salt of PPTA

A nitrogen flushed three neck reaction vessel equipped with mechanical stirrer was charged with 120 mL anhydrous DMSO and 50.4 mL of tetrabutylammonium hydroxide as a 1 molar solution in methanol. The methanol was removed from the resulting solution by means of vacuum distillation. Six g of PPTA pulp was added. The pulp dissolved in 16 hours to give an approximately 4 wt. % solution, which was optically isotropic. Twenty-one g of this 4 wt. % solution was added slowly to approximately 500 mL of anhydrous tetrahydrofuran with rapid stirring to give a red precipitated solid which weighed 2.57 g after drying. This solid is predominantly the (n-Bu)$_4$N$^+$ salt of PPTA, the reminder being solvent. A sample of 1.0 g of this solid was redissolved in 2.9 g of DMSO to give a highly viscous, somewhat pasty, mixture which flowed as a solution and was optically birefringent as determined by optical microscopy.

EXAMPLE 5

Preparation of the (n-Bu)$_4$N$^+$ Salt of PPTA

To a 100 ml round bottomed flask was added 40 ml DMSO and 5 ml of a 25% by weight of tetrabutylammonium hydroxide in methanol solution (Alfa Chemicals). The flask was connected to vacuum via a nitrogen trap and warmed to ~50° C. The flask was held under vacuum until the pressure in the flask was similar to the vapor pressure of DMSO at 50° C. (~5 mmHg) indicating than the methanol had substantialy been removed. PPTA was then placed in the flask (600 mg sifted PPTA) and the vacuum reapplied (to continue removing residual methanol). The PPTA dissolved within 1 hour as witnessed by the simultaneous disappearance of the yellow polymer and appearance of the characteristic red solution.

EXAMPLE 6

Preparation of the Et$_4$N$^+$ Salt of Poly (m-phenylenediamine isophthalamide)

(MPD-I) and of a Film Therefrom

Et$_4$N$^+$OH$^-$ (3.33 g) was dissolved in 80 mL of DMSO. MPD-I (2.01 g) was then added and the resulting slurry was stirred for one week at room temperature. The resulting solution was filtered through glass wool to remove a trace of insoluble species. Under a dry nitrogen atmosphere, several drops of the solution were placed on a glass slide which was then heated on a hot plate to 210° C. to give an MPD-I film with an infrared spectrum identical to authentic MPD-I.

We claim:

1. A process for the preparation of polyamide articles of manufacture comprising
   (a) forming a polyarylamide solution by contacting polyamides derived from polymer repeat units independently selected from the group consisting of $$-NHRC(=O)-, \quad -R-\underset{H}{N}-\underset{\parallel}{\overset{O}{C}}-\underset{H}{N}-$$

and $$-Ar\underset{\underset{H}{N}}{\overset{N}{\diagup\diagdown}}C-$$

wherein:
R is selected from R$^3$ and R$^1$NHC (=O)R$^2$,
R$^1$ and R$^3$, independently, are selected from m-phenylene, p-phenylene, 3,3'-biphenylene, 3,4'-biphenylene, 4,4'-biphenylene and 4,4'-diphenylene ether,
R$^2$ is selected from R$^1$ and $$-(CH_2)_{\overline{x}},$$

Ar is 1,2,4-benzenetriyl, and
x is 1 to 10,
the polyamide having a molecular weight of at least about 2500; with a solution of a quaternary ammonium base of the formula $$R^4{}_4N^+X^-$$

wherein each R$^4$ is independently selected from hydrocarbyl or substituted hydrocarbyl, provided that at least one of the R$^4$ groups contains at least one beta hydrogen atom;
and wherein X is an anion whose conjugate acid has a pKa greater than that of the hydrogen attached to the amide group in the unreacted polymer repeat units,
   (b) casting an article from the polyarylamide solution;

(c) evaporating the solvent; and
(d) heating the polyarylamide either concurrently with or after evaporating the solvent in the range 70°–300° C. such that a polyamide is formed by elimination and/or alkylation.

2. The process of claim 1 wherein in step (d) the polyamide is formed predominantly by alkylation.

3. The process of claim 1 wherein in step (d) the polyarylamide is heated in the range of 150°–300° C.

4. The process of claim 2 wherein in step (d) the polyamide is formed predominantly by elimination.

5. The process of claim 2 wherein said article is a film.

6. The process of claim 2 wherein in step (d) the polyarylamide is heated in the range of 180°–250° C.

7. A process for improving adhesion of polyamide articles to other articles comprising
(a) contacting a polyamide part, wherein the polyamide is a polymer of repeat units independently selected from the group consisting of

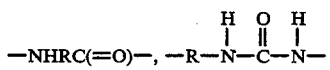

and

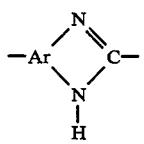

wherein:
R is selected from $R^3$ and $R^1NHC(=O)R^2$,
$R^1$ and $R^3$, independently, are selected from m-phenylene, p-phenylene, 3,3'-biphenylene, 3,4'-biphenylene, 4,4'-biphenylene and 4,4'-diphenylene ether,
$R^2$ is selected from $R^1$ and

Ar is 1,2,4-benzenetriyl, and
x is 1 to 10,
the polyamide having a molecular weight of at least about 2500; with a solution of a quaternary ammonium base of the formula

wherein each $R^4$ is independently selected from hydrocarbyl or substituted hydrocarbyl, provided that an least one of the $R^4$ groups contains at least one beta hydrogen atom;
and wherein X is an anion whose conjugate acid has a pKa greater than that of the hydrogen attached to the amide group in the unreacted polymer repeat units, for a period of time sufficient to form polyarylamides on the surface of said part, and without dissolving any substantial fraction of the polyamide;
(b) removing said part from said solution of a quaternary ammonium base; and
(c) contacting said part with the article to which it is to be adhered.

8. The process of claim 7 whereby in step (c) said part is adhered to another polyamide part similarly treated as in steps (a) and (b).

9. The process of claim 7 wherein said polyamide is selected from the group consisting of poly-(p-phenyleneterephthalamide) and poly (m-phenylene isophthalamide).

10. The process of claim 1 further comprising (e) removing olefins and tertiary amines formed as volatile byproducts through vaporization.

11. The process of claim 7 further comprising (d) heating said part to 70°–300° C. such that any polyarylamide present is converted to polyamide.

12. The process of claim 11 whereby in step (d) said part is heated to 150°–300° C.

13. The process of claim 11 whereby in step (d) said part is heated to 180°–250° C.

* * * * *